United States Patent
Cheng

(10) Patent No.: US 7,450,443 B2
(45) Date of Patent: Nov. 11, 2008

(54) PHASE DETECTION METHOD, MEMORY CONTROL METHOD, AND RELATED DEVICE

(75) Inventor: Wen-Chang Cheng, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 102 days.

(21) Appl. No.: 11/617,737

(22) Filed: Dec. 29, 2006

(65) Prior Publication Data

US 2008/0062780 A1  Mar. 13, 2008

(30) Foreign Application Priority Data

Sep. 7, 2006  (TW) .............................. 95133060 A

(51) Int. Cl.
*G11C 7/00* (2006.01)
*G11C 8/00* (2006.01)
*G11C 8/18* (2006.01)
*G01R 29/00* (2006.01)

(52) U.S. Cl. .................. 365/193; 365/194; 365/230.08; 365/233.1; 365/233.5; 327/2

(58) Field of Classification Search .................. 365/193, 365/194, 230.08, 233.1, 233.5; 237/2, 3
See application file for complete search history.

(56) References Cited

U.S. PATENT DOCUMENTS

| 7,245,553 B2 * | 7/2007 | Lin et al. .................. 365/233.1 |
| 2006/0140022 A1 * | 6/2006 | Lee ............................ 365/193 |
| 2007/0257717 A1 * | 11/2007 | Yoon ........................... 327/153 |

\* cited by examiner

*Primary Examiner*—Ly D Pham
(74) *Attorney, Agent, or Firm*—Winston Hsu

(57) ABSTRACT

A phase detection method for detecting a phase difference between a data strobe signal and a clock signal, includes: latching the clock signal according to the data strobe signal to generate a phase lead/lag detection result; delaying the data strobe signal to generate a plurality of delayed data strobe signals; latching the clock signal according to the delayed data strobe signals to generate a plurality of phase detection results corresponding to the delayed data strobe signals, respectively; and if the phase lead/lag detection result indicates that the data strobe signal leads the clock signal, utilizing the phase detection results to represent the phase difference between the data strobe signal and the clock signal. A memory control method and a memory control circuit respectively corresponding to the phase detection method are further provided.

6 Claims, 8 Drawing Sheets

| MO(j) | $Q_2$ | $Q_1$ | $Q_0$ |
|---|---|---|---|
| C0 | 1 | 1 | 0 |
| C1 | 1 | 0 | 0 |
| C2 | 0 | 0 | 0 |
| C0 | X | X | 1 |

Fig. 5

PHASE DETECTION METHOD, MEMORY CONTROL METHOD, AND RELATED DEVICE

BACKGROUND OF THE INVENTION

1. Field of the Invention

The present invention relates to random access memory (RAM) control, and more particularly, to phase detection methods, memory control methods, and related devices.

2. Description of the Prior Art

As information technology industries develop, semiconductor component technologies progress rapidly. In order to increase the writing or reading speed of random access memories (RAMs), double data rate (DDR) technology is introduced for related applications, where RAMs utilizing DDR technology can be referred to as DDR RAMs.

The data accessing of conventional RAMs corresponds to a specific edge of each of a plurality of periods of a clock signal. For example, the specific edge is a rising edge. As the data accessing of DDR RAMs corresponds to the rising and falling edges of each of a plurality of periods of a clock signal, the data accessing speed of DDR RAMs is twice as fast as the data accessing speed of conventional RAMs if their clock signals have the same frequency.

A data strobe signal differing from a clock signal can be applied to DDR RAMs for data accessing, where the data strobe signal mentioned above is also referred to as the DQS signal, and the signal format thereof is well known in the art. As shown in FIG. 1, when a write command WR is outputted, a plurality of periodic pulses should occur in the data strobe signal DQS after the data strobe signal DQS enters a low level. The rising and falling edges of these periodic pulses can be utilized as time references for writing data D0, D1, D2, D3, etc. carried by the data signal DQ into memory cells of a memory. In addition, within the waveform of the data strobe signal DQS shown in FIG. 1, the portion corresponding to the low level occurring before the periodic pulses' appearance is referred to as the preamble. Additionally, the time interval between a rising edge of the clock signal VCLK around the time point when the write command WR is issued and the first rising edge of the data strobe signal DQS around the end of the preamble is defined as $T_{DQSS}$.

In some situations, for example, a situation where the frequency of the clock signal VCLK is increased and the signal delay of some portions within a circuit system is not properly corrected, the data strobe signal DQS may not comply with a particular specification. Once the time interval $T_{DQSS}$ does not comply with the range defined by the specific specification mentioned above, the data carried by the data signal DQ cannot be guaranteed to be written into memory cells correctly.

SUMMARY OF THE INVENTION

It is therefore an objective of the claimed invention to provide phase detection methods, memory control methods, and related devices to solve the above-mentioned problem.

According to one embodiment of the claimed invention, a phase detection method for detecting a phase difference between a data strobe signal and a clock signal is disclosed. The phase detection method comprises: latching the clock signal according to the data strobe signal to generate a phase lead/lag detection result; delaying the data strobe signal to generate a plurality of delayed data strobe signals; latching the clock signal according to the delayed data strobe signals to generate a plurality of phase detection results corresponding to the delayed data strobe signals respectively; and if the phase lead/lag detection result indicates that the data strobe signal leads the clock signal, utilizing the phase detection results to represent the phase difference between the data strobe signal and the clock signal.

According to one embodiment of the claimed invention, a memory control method is disclosed. The memory control method comprises: latching a clock signal according to a data strobe signal to generate a phase lead/lag detection result; delaying the data strobe signal to generate a plurality of delayed data strobe signals; latching the clock signal according to the delayed data strobe signals to generate a plurality of phase detection results corresponding to the delayed data strobe signals respectively; latching write data carried by a data signal according to rising/falling edges of the data strobe signal; performing odd/even data separation on the write data to generate a data separation signal carrying odd/even data corresponding to the write data; and if the phase lead/lag detection result indicates that the data strobe signal leads the clock signal, delaying or bypassing the odd/even data carried by the data separation signal according to the phase detection results, wherein the phase detection results represent the phase difference between the data strobe signal and the clock signal, and the delay amount of the odd/even data corresponds to the phase detection results.

According to one embodiment of the claimed invention, a memory control circuit is disclosed. The memory control circuit comprises a phase detection module for detecting a phase difference between a data strobe signal and a clock signal. The phase detection module comprises: a plurality of delay lines for delaying the data strobe signal to generate a plurality of delayed data strobe signals; and a plurality of latches, coupled to the plurality of delay lines, where a latch of the latches is capable of latching the clock signal according to the data strobe signal to generate a phase lead/lag detection result, and the other latches of the plurality of latches are capable of latching the clock signal according to the delayed data strobe signals to generate a plurality of phase detection results corresponding to the delayed data strobe signals respectively. The memory control circuit further comprises: a latch module for latching write data carried by a data signal according to rising/falling edges of the data strobe signal; an odd/even data separator, coupled to the latch module, for performing odd/even data separation on the write data to generate a data separation signal carrying odd/even data corresponding to the write data; and an adjustable delay line module, coupled to the odd/even data separator and the phase detection module, wherein if the phase lead/lag detection result indicates that the data strobe signal leads the clock signal, the adjustable delay line module delays or bypasses the odd/even data carried by the data separation signal according to the phase detection results, the phase detection results represent the phase difference between the data strobe signal and the clock signal, and the delay amount of the odd/even data corresponds to the phase detection results.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 illustrates the input signal selection performed by the multiplexer shown in FIG. 4 according to the phase lead/lag detection result and the phase detection results carried by the control signal controlling the multiplexer.

DETAILED DESCRIPTION

Figure 1:
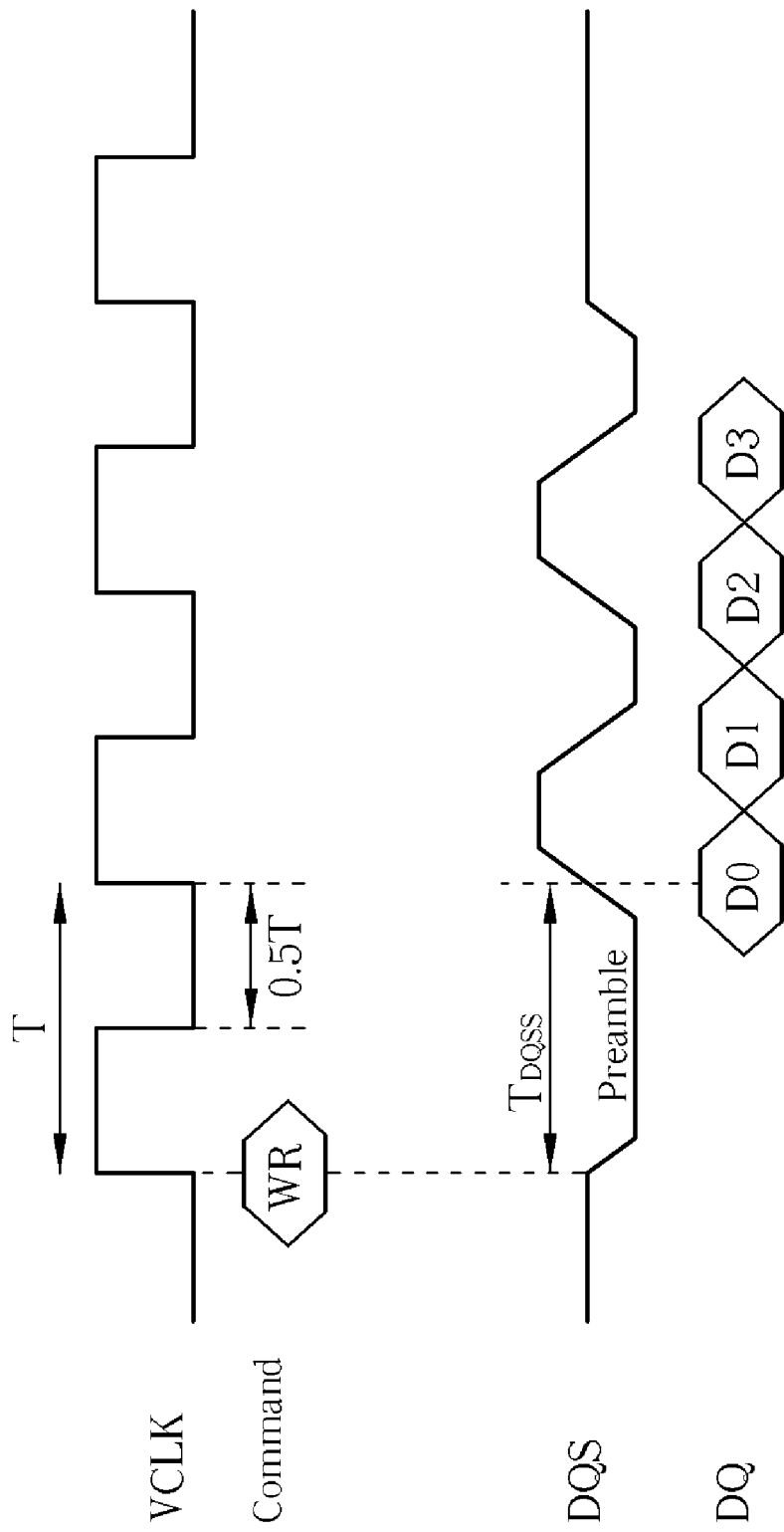
FIG. 1 is a diagram of a data strobe signal and a data signal according to the prior art.
Figure 2:
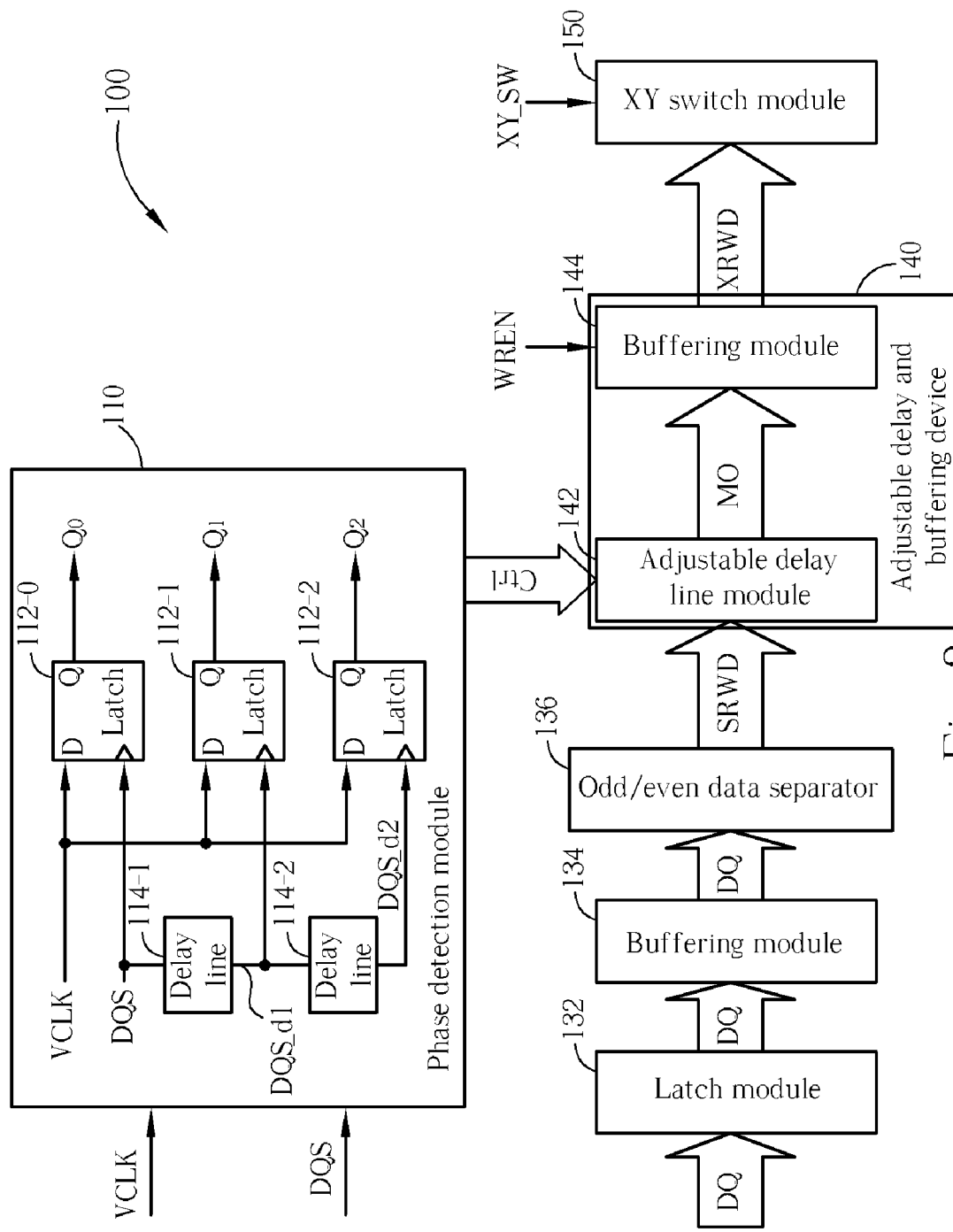
FIG. 2 is a diagram of a memory control circuit according to one embodiment of the present invention.

Please refer to FIG. 2. FIG. 2 is a diagram of a memory control circuit 100 according to a preferred embodiment of the present invention, where the memory control circuit 100 comprises a phase detection module 110, a latch module 132, a buffering module 134, an odd/even data separator 136, an adjustable delay and buffering device 140, and a switch module, where the adjustable delay and buffering device 140 comprises an adjustable delay line module 142 and a buffering module 144, and the switch module in this embodiment is the XY switch module 150. As shown in FIG. 2, the phase detection module 110 comprises a plurality of latches 112-0, 112-1, and 112-2 and a plurality of delay lines 114-1 and 114-2, where each delay line comprises a plurality of delay units (not shown).

The phase detection module 110 is capable of detecting a phase difference between the data strobe signal DQS and the clock signal VCLK mentioned above. Within the phase detection module 110 shown in FIG. 2, the latch 112-0 latches the clock signal VCLK according to the data strobe signal DQS to generate a phase lead/lag detection result $Q_0$, and the delay lines 114-1 and 114-2 are utilized for delaying the data strobe signal DQS to generate a plurality of delayed data strobe signals DQS_d1 and DQS_d2. In this embodiment, the delay line 114-1 delays the data strobe signal DQS to generate the delayed data strobe signal DQS_d1, and the delay line 114-2 delays the delayed data strobe signals DQS_d1 to generate the delayed data strobe signal DQS_d2. According to other embodiments of the present invention, the delayed data strobe signal DQS_d2 can be generated by utilizing a delay line within the phase detection module to delay the data strobe signal DQS directly.

In addition, the latches 112-1 and 112-2 latch the clock signal VCLK according to the delayed data strobe signals DQS_d1 and DQS_d2 to generate a plurality of phase detection results $Q_1$ and $Q_2$ corresponding to the delayed data strobe signals DQS_d1 and DQS_d2, respectively. As shown in FIG. 2, the phase detection module 110 of this embodiment outputs a control signal Ctrl, where the control signal Ctrl carries the phase lead/lag detection result $Q_0$ and the phase detection results $Q_1$ and $Q_2$ mentioned above.

Additionally, the latch module 132 is capable of latching the write data carried by the data signal DQ according to the rising/falling edges of the data strobe signal DQS, for further buffering by the buffering module 134. The odd/even data separator 136 performs odd/even data separation on the buffered write data to generate a data separation signal SRWD, where the data separation signal SRWD carries the odd/even data corresponding to the write data.

According to this embodiment, on one hand, if the phase lead/lag detection result $Q_0$ carried by the control signal Ctrl indicates that the data strobe signal DQS leads the clock signal VCLK, the adjustable delay line module 142 delays or bypasses the odd/even data carried by the data separation signal SRWD according to the phase detection results $Q_1$ and $Q_2$ carried by the control signal Ctrl. Here, the phase detection results $Q_1$ and $Q_2$ represent the phase difference between the data strobe signal DQS and the clock signal VCLK, and the delay amount of the odd/even data corresponds to the phase detection results $Q_1$ and $Q_2$, so the delay amount of the odd/even data also corresponds to the phase difference. On the other hand, if the phase lead/lag detection result $Q_0$ carried by the control signal Ctrl indicates that the data strobe signal DQS lags behind the clock signal VCLK, the adjustable delay line module 142 bypasses the odd/even data carried by the data separation signal SRWD rather than delaying the odd/even data. Thus, the adjustable delay line module 142 is capable of selectively delaying the odd/even data carried by the data separation signal SRWD according to the control signal Ctrl, where the delay amount of the odd/even data corresponds to the control signal Ctrl.

Through the adjustable delay control architecture as mentioned above, if the phase lead/lag detection result $Q_0$ indicates that the data strobe signal DQS leads the clock signal VCLK, the adjustable delay line module 142 outputs an output signal MO, where the output signal MO corresponds to the data separation signal SRWD, and carries the delayed or bypassed odd/even data. In addition, if the phase lead/lag detection result $Q_0$ indicates that the data strobe signal DQS lags behind the clock signal VCLK, the adjustable delay line module 142 bypasses the data separation signal SRWD as the output signal MO. As a result, the output signal MO is inputted into the buffering module 144 for further buffering processing.

As shown in FIG. 2, the buffering module 144 performs buffering control on the odd/even data outputted by the adjustable delay line module 142 according to the write enabling signal WREN. When the write enabling signal WREN is at an enabling state, the buffering module 144 may output the odd/even data outputted by the adjustable delay line module 142 to the XY switch module 150. As a result, the XY switch module 150 may output the odd/even data buffered by the buffering module 144 according to at least one selection signal XY_SW, for further writing into memory cells of a memory. The write enabling signal WREN and the selection signal XY_SW mentioned above are well known in the art, and therefore not explained in detail here.

Figure 3:
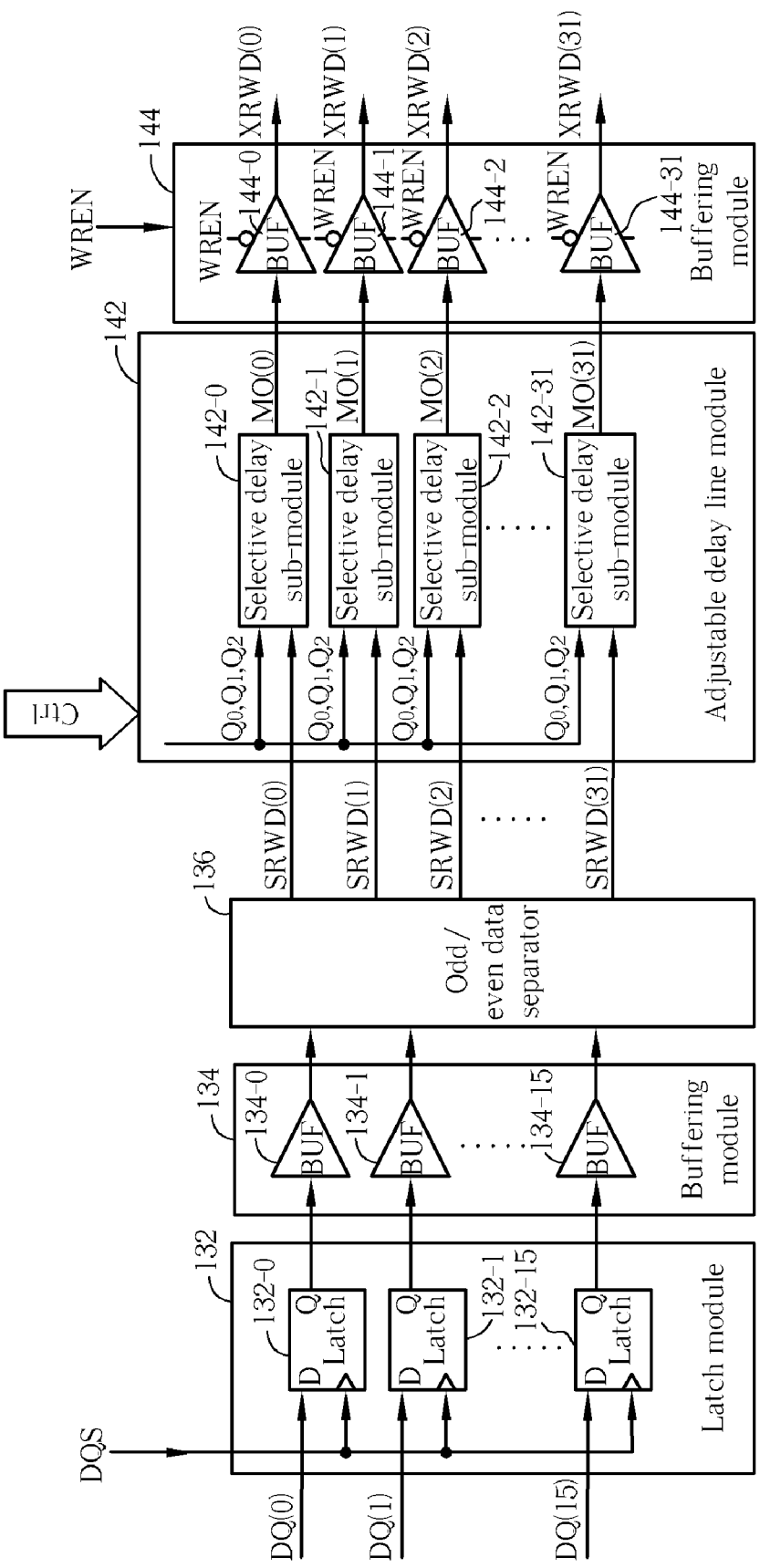
FIG. 3 illustrates implementation details of a portion of components shown in FIG. 2.

According to this embodiment, implementation details of a portion of components shown in FIG. 2 are illustrated as shown in FIG. 3. The latch module 132 comprises a plurality of latches 132-0, 132-1, ..., and 132-15 respectively corresponding to a plurality of bits DQ(0), DQ(1), ..., and DQ(15) of the data signal DQ, where each latch 132-$i$ ($i$=0, 1, ... 15) latches a bit DQ($i$) of the data signal DQ according to the data strobe signal DQS. The bits DQ(0), DQ(1), ..., and DQ(15) of the data signal DQ latched by the latches 132-0, 132-1, ..., and 132-15 are outputted to the odd/even data separator 136 respectively through the corresponding buffers 134-0, 134-1, ..., and 134-15 in the buffering module 134, for performing odd/even data separation. The data separation signal SRWD generated after performing the odd/even data separation includes a plurality of bits SRWD(0), SRWD(1), ..., and SRWD(31).

As shown in FIG. 3, the adjustable delay line module 142 comprises a plurality of selective delay sub-modules 142-0, 142-1, ..., and 142-31 respectively corresponding to the plurality of bits SRWD(0), SRWD(1), . . . , and SRWD(31) of the data separation signal SRWD, where each selective delay sub-module 142-j (j=0, 1, . . . , 31) is utilized for selectively applying the delay amount corresponding to the phase detection results $Q_1$ and $Q_2$ to a bit SRWD(j) of the data separation signal SRWD or bypassing the bit SRWD(j) to generate the corresponding bit MO(j) of the output signal MO, and the bit MO(j) of the output signal MO is outputted into the corresponding buffer 144-j in the buffering module 144 for further buffering processing as mentioned, where the bit MO(j) of the output signal MO can be utilized as the corresponding bit XRWD(j) of the output signal XRWD. Similar descriptions are not repeated here.

Figure 4:
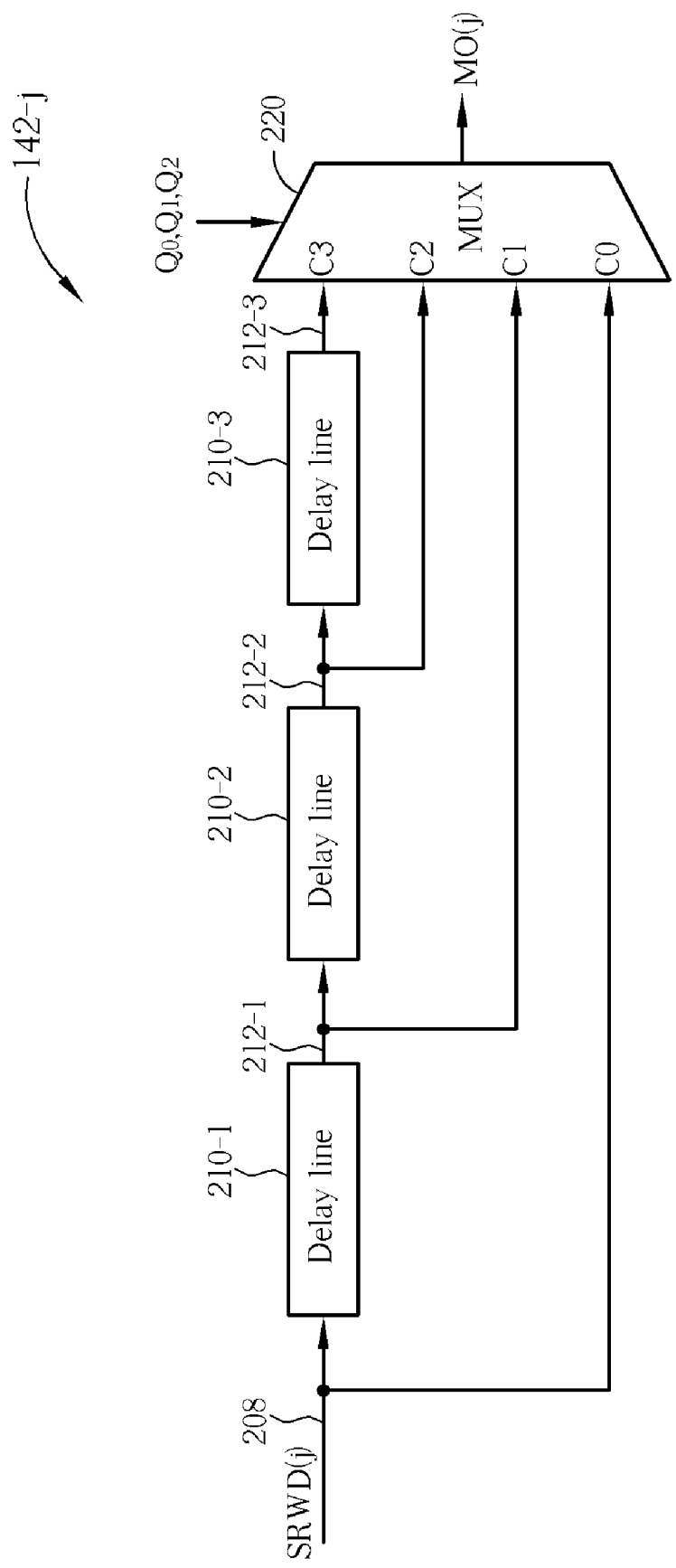
FIG. 4 is a diagram of a selective delay sub-module according to one embodiment of the present invention.
Figure 5:
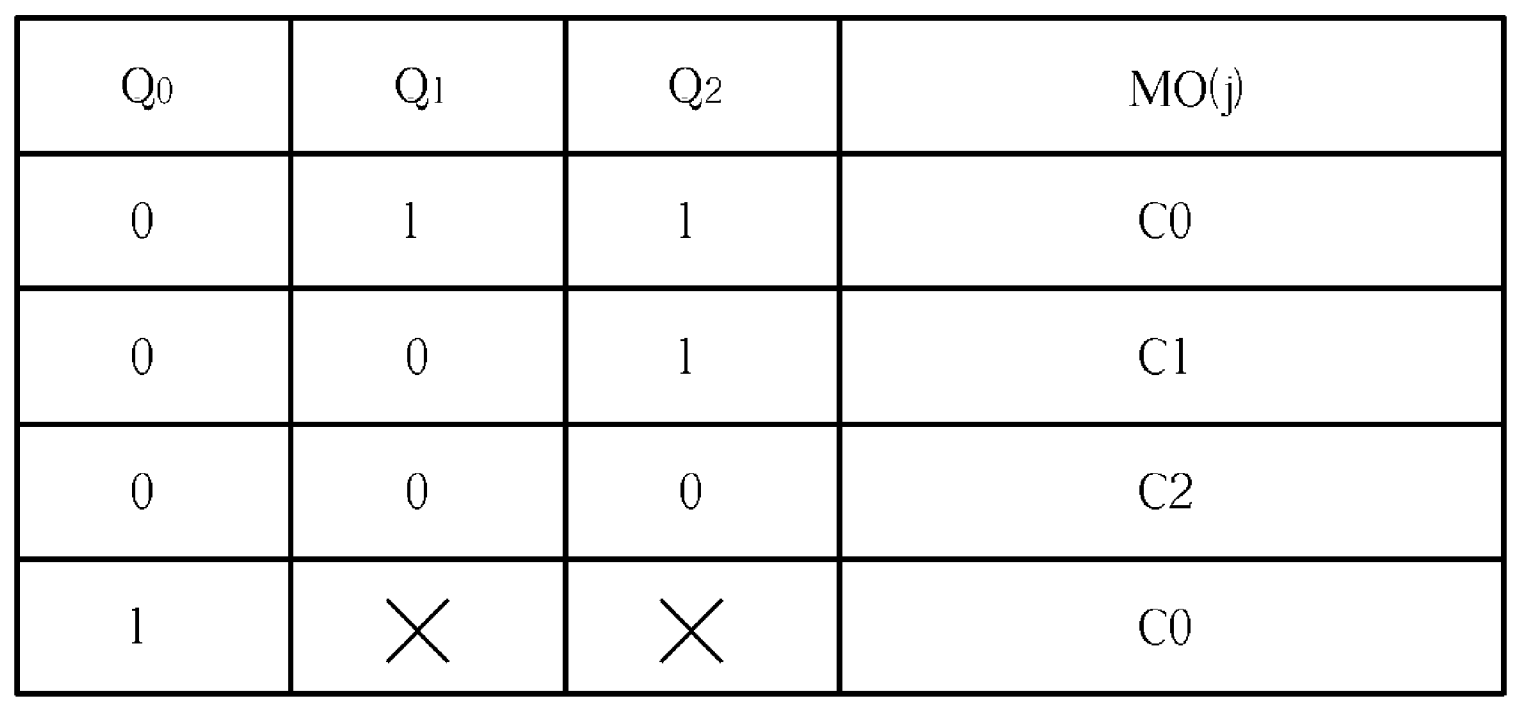
Figure 6:
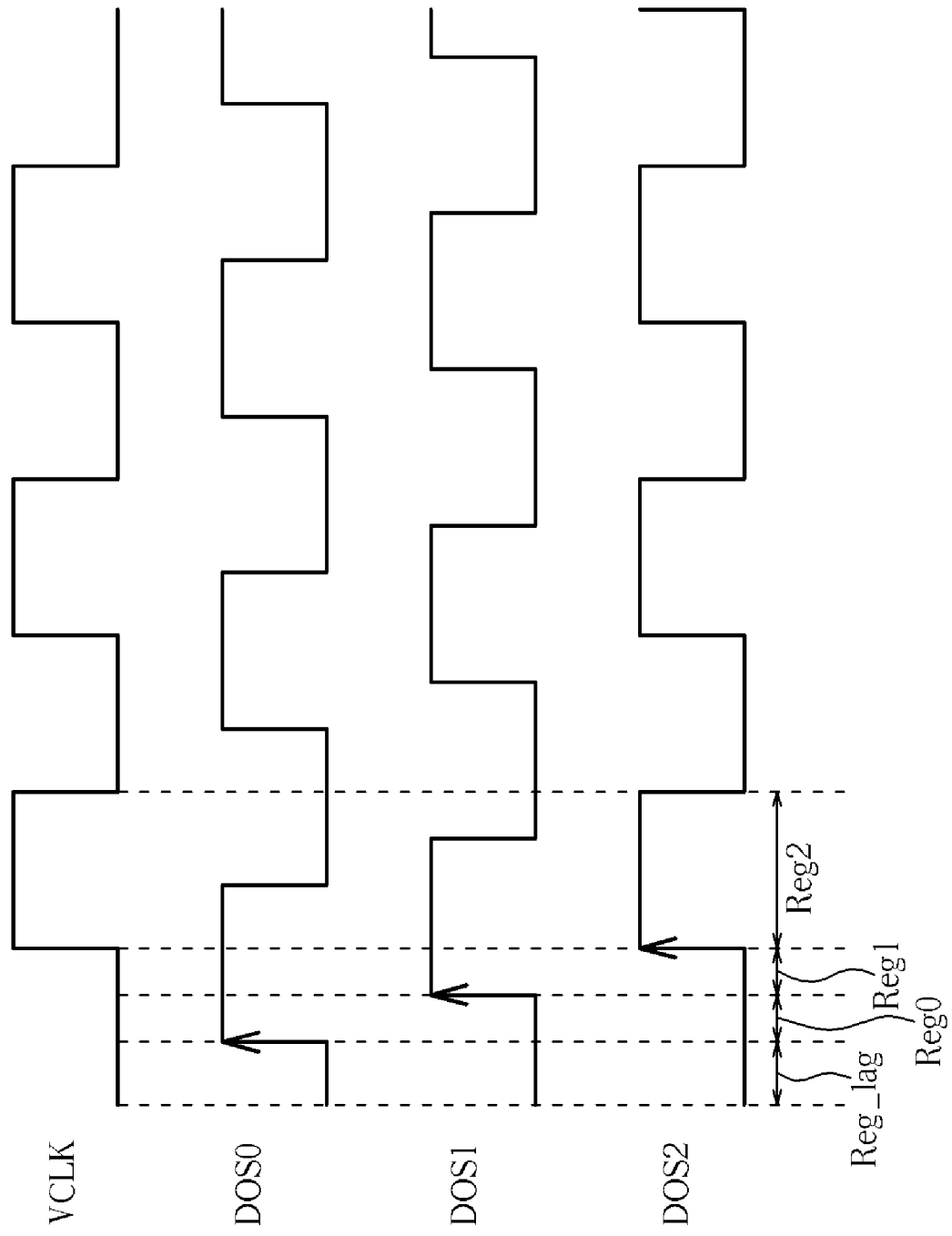
FIG. 6 illustrates various waveforms of the data strobe signal in different lead/lag statuses according to the embodiment shown in FIG. 4.

Please refer to FIG. 4, FIG. 5, and FIG. 6. FIG. 4 is a diagram of the selective delay sub-module 142-j according to one embodiment of the present invention, FIG. 5 illustrates the input signal selection performed by the multiplexer 220 shown in FIG. 4 according to the phase lead/lag detection result $Q_0$ and the phase detection results $Q_1$ and $Q_2$ carried by the control signal Ctrl controlling the multiplexer 220, and FIG. 6 illustrates various waveforms of the data strobe signal DQS in different lead/lag statuses according to the embodiment shown in FIG. 4, where these waveforms are respectively labeled as DQS0, DQS1, and DQS2. The selective delay sub-module 142-j shown in FIG. 4 can be applied to the embodiment shown in FIG. 3, where j=0, 1, . . . , 31. As shown in FIG. 4, the selective delay sub-module 142-j of this embodiment comprises a plurality of delay lines 210-1, 210-2, and 210-3 and the multiplexer 220 mentioned above, where the delay lines 210-1, 210-2, and 210-3 are utilized for delaying the bit SRWD(j) of the data separation signal SRWD.

According to this embodiment, if the first rising edges of these waveforms DQS0, DQS1, and DQS2 of the data strobe signal DQS are utilized as references for dividing a period of the clock signal VCLK around the corresponding time points of the first rising edges into a plurality of regions Reg_lag, Reg0, Reg1, and Reg2, the regions Reg0, Reg1, and Reg2 respectively correspond to a situation where $(Q_0, Q_1, Q_2)=(0, 1, 1)$, a situation where $(Q_0, Q_1, Q_2)=(0, 0, 1)$, and a situation where $(Q_0, Q_1, Q_2)=(0, 0, 0)$ as shown in FIG. 5, and the region Reg_lag corresponds to a situation where $Q_0=1$ as shown in FIG. 5. If the phase lead/lag detection result $Q_0$ indicates that the data strobe signal DQS leads the clock signal VCLK, which corresponds to the situations where $Q_0=0$ as shown in FIG. 5 according to this embodiment, the multiplexer 220 multiplexes the delayed odd/even data at an output terminal of output terminals 212-1 and 212-2 (i.e. the delayed odd/even data at the output terminal 212-1 of the delay line 210-1 or the output terminal 212-2 of the delay line 210-2), or multiplexes the odd/even data at an input terminal 208 of the first delay line 210-1 of the plurality of delay lines (210-1, 210-2, and 210-3) according to the phase detection results $Q_1$ and $Q_2$. For example, when $(Q_0, Q_1, Q_2)=(0, 0, 0)$, the multiplexer 220 multiplexes the signal at the input terminal C2, i.e. the delayed odd/even data at the output terminal 212-2 of the delay line 210-2; and when $(Q_0, Q_1, Q_2)=(0, 1, 1)$, the multiplexer 220 multiplexes the signal at the input terminal C0, i.e. the odd/even data at the input terminal 208 of the delay line 210-1.

On the other hand, if the phase lead/lag detection result $Q_0$ indicates that the data strobe signal DQS lags behind the clock signal VCLK, which corresponds to the situations where $Q_0=1$ as shown in FIG. 5 according to this embodiment, the multiplexer 220 multiplexes the odd/even data at the input terminal 208 of the first delay line 210-1 to bypass the bit SRWD(j) of the data separation signal SRWD. In this situation, the output MO(j) of the multiplexer 220 is independent of the phase detection results $Q_1$ and $Q_2$, where a notation "X" is utilized for labeling the corresponding situations.

According to a variation of this embodiment, the multiplexer 220 may multiplex a signal at the input terminal C3 according to information carried by the control signal Ctrl, for example, according to a certain combination of $(Q_0, Q_1, Q_2)$, or a combination of $(Q_0, Q_1, Q_2)$ and some other information.

According to a variation of the embodiment shown in FIG. 2, the number of phase difference detections (i.e. the number of detections of the phase difference) performed by the phase detection module 110 regarding each write command WR can be limited, for example, to one time at most. In addition, the number of delay amount adjustments (i.e. the number of adjustments of the delay amount) regarding each write command WR can be limited, for example, to one time at most.

Figure 7:
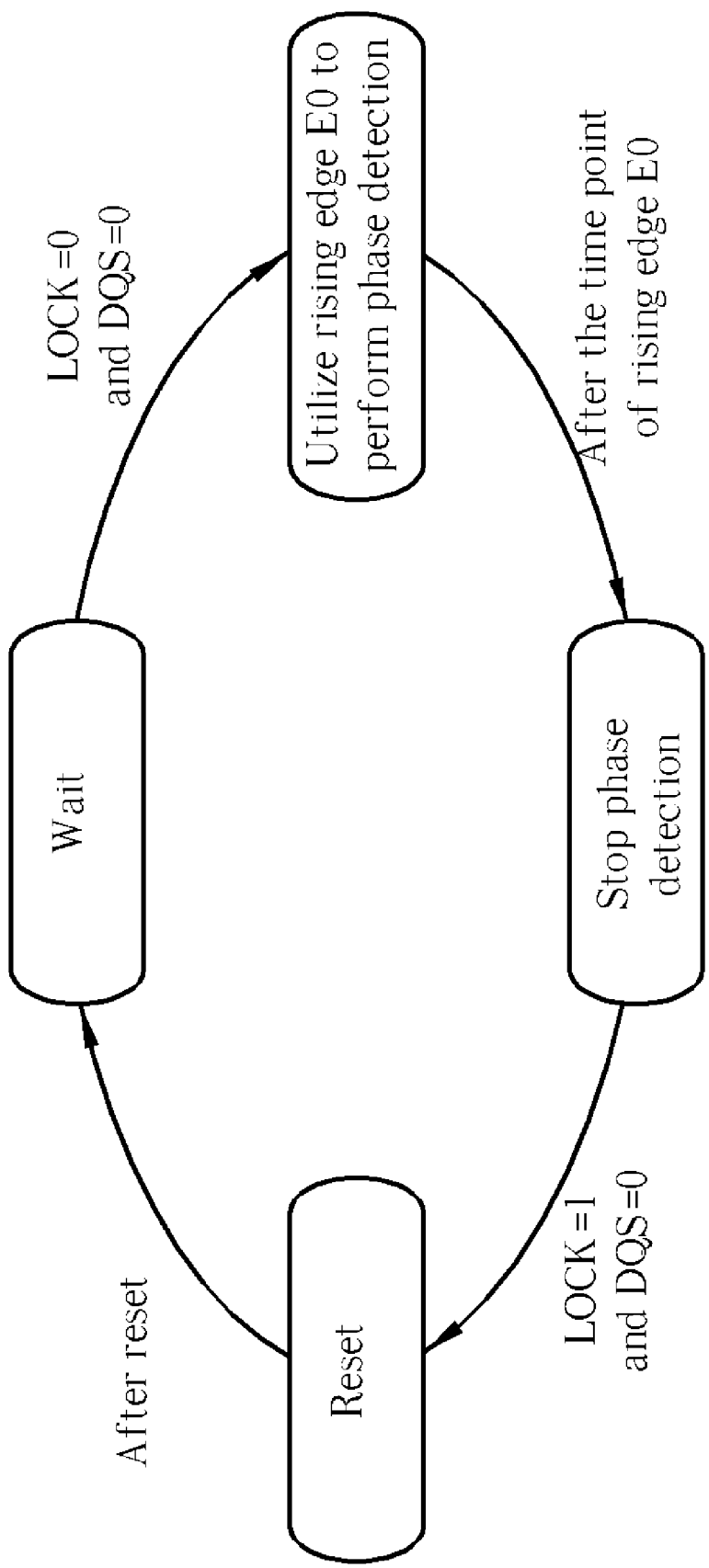
FIG. 7 is a state diagram of the phase detection according to a variation of the embodiment shown in FIG. 2.
Figure 8:
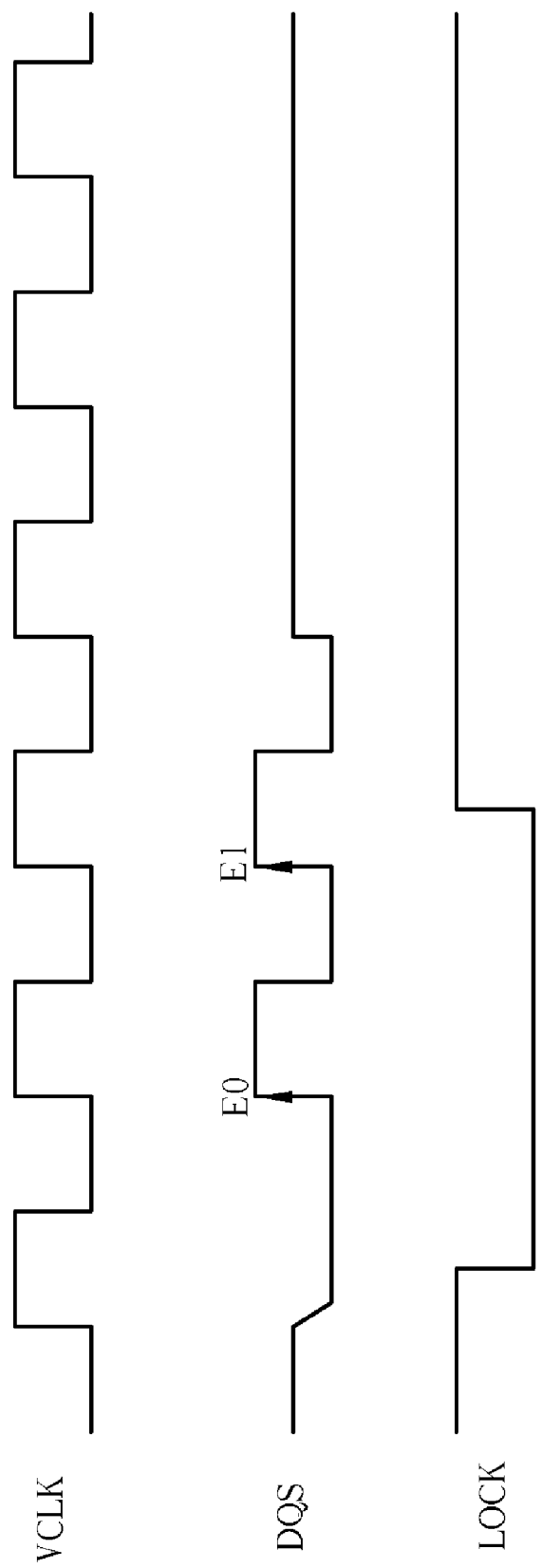
FIG. 8 illustrates a rising edge and a locking signal utilized in a variation of the embodiment shown in FIG. 2.

Please refer to FIG. 7 and FIG. 8. FIG. 7 is a state diagram of the phase detection according to the variation, and FIG. 8 illustrates a rising edge E0 and a locking signal LOCK utilized in the variation. According to this variation, the phase detection module 110 may utilize the rising edge E0 of the first pulse of a plurality of periodic pulses after the preamble's appearance in the data strobe signal DQS to detect the phase difference, and may utilize the preamble/postamble in the data strobe signal DQS to determine whether to start/stop detecting the phase difference. As shown in FIG. 7, the phase detection module 110 utilizes the rising edge E0 to perform the phase detection, and stops the phase detection after the time point of the rising edge E0. In the situation where the phase detection is stopped as mentioned, once the locking signal LOCK shown in FIG. 8 is at a high level (i.e. the situation where LOCK=1) and the data strobe signal DQS shown in FIG. 8 is at a low level (i.e. the situation where DQS=0, which represents the postamble here), the phase detection module 110 resets and enters a waiting status after reset. In addition, in the waiting status mentioned above, once the locking signal LOCK is at a low level (i.e. the situation where LOCK=0) and the data strobe signal DQS is at the low level thereof (i.e. the situation where DQS=0, which represents the preamble here), the phase detection module 110 utilizes the rising edge E0 to perform the phase detection as mentioned.

The present invention can therefore solve the prior art problem where data carried by the data signal DQ is not guaranteed to be written into memory cells correctly when the time interval $T_{DQSS}$ in the data strobe signal DQS does not comply with the specific specification.

By utilizing the phase difference detection architecture and the selective delay architecture for the data separation signal SRWD according to some embodiments of the present invention, the memory control circuits and methods may adjust or bypass the data separation signal SRWD correspondingly to maintain the appearances of the odd/even data carried by the output signal MO within substantially the same time interval. That is, according to these embodiments, the present invention may keep the size of the signal window of the output signal MO independent of the lead or lag statuses of the data strobe signal DQS. Therefore, the odd/even data carried by the output signal MO can be written normally into memory cells of the memory through the buffering module 144 and the XY switch module 150.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase detection method for detecting a phase difference between a data strobe signal and a clock signal, the phase detection method comprising:

latching the clock signal to selectively generate a phase lead detection result and a phase lag detection result in response to the data strobe signal;

delaying the data strobe signal to generate a plurality of delayed data strobe signals;

latching the clock signal to generate a plurality of phase detection results in response to the delayed data strobe signals so as to correspond to the delayed data strobe signals; and utilizing the phase detection results to represent the phase difference between the data strobe signal and the clock signal in a situation where the data strobe signal leads the clock signal.

2. The phase detection method of claim 1, wherein the data strobe signal is a DQS signal.

3. The phase detection method of claim 1, wherein the delayed data strobe signals comprise a first delayed data strobe signal and a second delayed data strobe signal, and the step of delaying the data strobe signal to generate the plurality of delayed data strobe signals further comprises:

delaying the data strobe signal to generate the first delayed data strobe signal; and delaying the data strobe signal or the first delayed data strobe signal to generate the second delayed data strobe signal.

4. The phase detection method of claim 1, wherein for a write command, the detection of the phase difference is performed once.

5. The phase detection method of claim 4, further comprising:

utilizing a rising edge of the first pulse of a plurality of periodic pulses after a preamble's appearance in the data strobe signal to detect the phase difference.

6. The phase detection method of claim 4, further comprising:

utilizing the preamble/postamble in the data strobe signal to determine whether to start/stop detecting the phase difference.

* * * * *